United States Patent [19]

Gibson et al.

[11] Patent Number: 4,770,704
[45] Date of Patent: Sep. 13, 1988

[54] CONTINUOUS METHOD FOR MANUFACTURING GRAIN-ORIENTED MAGNETOSTRICTIVE BODIES

[75] Inventors: Edwin D. Gibson; John D. Verhoeven; Frederick A. Schmidt; O. Dale McMasters, all of Ames, Iowa

[73] Assignee: Iowa State University Research Foundation, Inc., Ames, Iowa

[21] Appl. No.: 25,572

[22] Filed: Mar. 13, 1987

[51] Int. Cl.⁴ .............................................. H01F 1/02
[52] U.S. Cl. .................................. 75/65 ZM; 148/100
[58] Field of Search ..................... 75/65 ZM, 65 EB; 148/100

[56] References Cited

U.S. PATENT DOCUMENTS 4,609,402  9/1986  McMasters ..................... 75/65 ZM Primary Examiner—Peter D. Rosenberg
Attorney, Agent, or Firm—Tilton, Fallon, Lungmus & Chestnut

[57] ABSTRACT

The invention comprises a continuous casting and crystallization method for manufacturing grain-oriented magnetostrictive bodies. A magnetostrictive alloy is melted in a crucible having a bottom outlet. The melt is discharged through the bottom of the crucible and deposited in an elongated mold. Heat is removed from the deposited melt through the lower end portion of the mold to progressively solidify the melt. The solid-liquid interface of the melt moves directionally upwardly from the bottom to the top of the mold, to produce the axial grain orientation.

12 Claims, 3 Drawing Sheets

CONTINUOUS METHOD FOR MANUFACTURING GRAIN-ORIENTED MAGNETOSTRICTIVE BODIES

SUPPORT REFERENCE

This invention was conceived and reduced to practice under a contract with the Department of Energy.

FIELD OF INVENTION

The field of this invention is the manufacturing of magnetostrictive metal bodies. The invention is particularly concerned with the conversion of rare earth-iron magnetostrictive alloys into grain-oriented magnetostrictive rods.

BACKGROUND OF INVENTION

In recent years considerable research has been devoted to the development of magnetostrictive compounds, and in particular rare earth-iron alloys. These developments are summarized by A. E. Clark, Chapter 7, pages 531–589, in "Ferromagnetic Materials," Vol. 1 (Ed. E. P. Wohlfarth, North-Holland Publ. Co., 1980). A major objective of the research has been to develop rare earth-iron alloys with large room temperature magnetostriction constants. Technically important alloys having these properties include alloys of terbium together with dysposium and/or holmium. The relative proportions of the rare earths and the iron are varied to maximize room temperature magnetostriction and minimize magnetic anisotropy. Presently, the most technically advanced alloy of this kind is represented by the formula $Tb_xDy_{1-x}Fe_{1.5-2.0}$ wherein x is a number from 0.27 to 0.35. An optimized ratio is $Tb_{0.3}Dy_{0.7}Fe_{1.9}$ which is known as terfenol-D, as described in U.S. Pat. No. 4,308,474.

Such rare earth-iron alloys are true compounds and can exist in crystalline or polycrystalline form. In preparing elongated bodies (viz. rods) from such alloys, grain-orientation of the crystals is essential for achieving high magnetostriction. An axial grain orientation of the crystallites not only increases the magnetostriction constant but also reduces internal losses at the grain boundaries. This is particularly important in applications where a high magnetostriction at low applied fields is required. (See Clark, cited above, pages 545–547).

U.S. Pat. No. 4,609,402 of O. Dale McMasters describes a sequential process for casting magnetostrictive rods, and thereafter subjecting the rods to zone melting and recrystallization to obtain an axial grain orientation. In the casting process, a hollow mold tube is positioned with its lower end portion within a molten body of the alloy contained in a crucible. A pressure differential is created between the chamber enclosing the crucible and the mold tube so that the alloy melt is forced upwardly through the bottom of the mold tube to a selected level for molding an elongated rod. A portion of the molten alloy is left in the crucible so that solid particles of higher melting impurities present in the alloy collect at the surface of the melt remain within the crucible as the rod is cast from the subsurface melt. After solidification, the rod is removed from the mold tube, and in a separate operation is subjected to a free-standing zone-melting, and recrystallization, to produce an axial grain orientation.

Although the method of the McMasters patent is capable of producing high quality magnetostrictive rods, there has been a need for a more continuous casting and crystallization process adapted to larger volume production. At the same time, however, it has been desired to maintain the impurity-separation advantage of the McMasters method, and also to achieve at least as effective axial grain orientation as with the McMasters method. Prior to the present invention, these related objectives had not been satisfactorily achieved.

SUMMARY DESCRIPTION OF INVENTION

The method of the present invention utilizes a bottom-pouring crucible in combination with a controlled directional solidification to achieve continuous casting and grain-oriented crystallization of magnetostrictive bodies. The melt-forming crucible is provided with a bottom outlet port having an openable closure. The crucible is enclosed within the upper portion of a downwardly-extending chamber. Induction heating means is provided around the crucible for melting and mixing a quantity of the rare earth-iron alloy.

A mold tube with an open top and closed bottom is positioned below the crucible in alignment with its bottom outlet port. By opening the port, the melt is deposited in the mold tube where it remains in liquid form. Preferably heating means is provided around the mold tube to preheat the tube and assist in maintaining the melt in liquid condition prior to the zone-solidification.

Cooling means are provided for removing heat through the lower end portion of the mold tube. By establishing this downward heat removal path, the melt is progressively solidified from the bottom to the top of the casting. A solid-liquid interface first forms at the bottom of the mold tube and moves progressively upward as the downward heat flow continues. The bottom of the mold tube preferably comprises a heat-transfer wall. In a specific design, the tube is mounted at its lower end on a pedestal-type support which contains a liquid-flow cooling chamber in heat transfer relation with the mold bottom wall. The removal of heat by this type of cooling arrangement can comprise the sole cooling means for establishing the removal path. However, other auxiliary cooling chambers can be provided for withdrawing heat for the lower end portion of the mold tube, such as through its side walls.

The bottom pouring feature of the method can be carried out so that impurities present in the alloy can be left within the crucible after pouring. As the melt is formed in the crucible, higher melting, lower density impurities collect at or near the surface of the melt. By leaving a small portion of the melt within the crucible (viz., by the outlet port being closed before the crucible is emptied of melt), the surface-collected impurities can be retained within the crucible. They can be removed from the crucible before its next casting use. For example, the crucibles can be replaceable, so that a series of crucibles can be used in sequence.

Additional means or method steps may be employed to achieve more rapid solidification of the cast bodies, while obtaining the desired axial grain orientation. Even though the mold tubes are formed of a refractory material, such as quartz, the longer the reactive melt is maintained in contact with the mold the greater the opportunity for contamination. It is desired to carry out the solidification and crystallization of the alloy as rapidly as possible.

In one preferred arrangement, the lower end portion of the mold tube is mounted on retractable support which permits movement of the mold tube within the chamber. For example, after deposit of the melt in the mold, it can be moved downwardly away from the mold heater and/or into heat transfer relation with auxilliary cooling means. This arrangement is particularly desirable when, as preferred, both a heating means for the mold tube is provided together with an auxilliary cooling means. Such auxilliary cooling means may be provided around a lower portion of the chamber, being located below the melt-receiving position of the mold tube bottom. As the mold is moved downwardly with the melt therein, it is brought to a position so that at least its lower end portion is adjacent the auxilliary cooling means. This arrangement can increase the rate of downward heat flow and accelerate the upwardly directed solidification and crystallization.

If desired, instead of using a mold tube with a single molding chamber, multiple mold tubes may be used. For example, a plurality of small mold tubes may be inserted within a larger mold tube.

THE DRAWINGS

Apparatus for practicing the method of this invention is diagrammatically illustrated in the accompanying drawings.

DETAILED DESCRIPTION OF INVENTION

Figures 1, 1A:
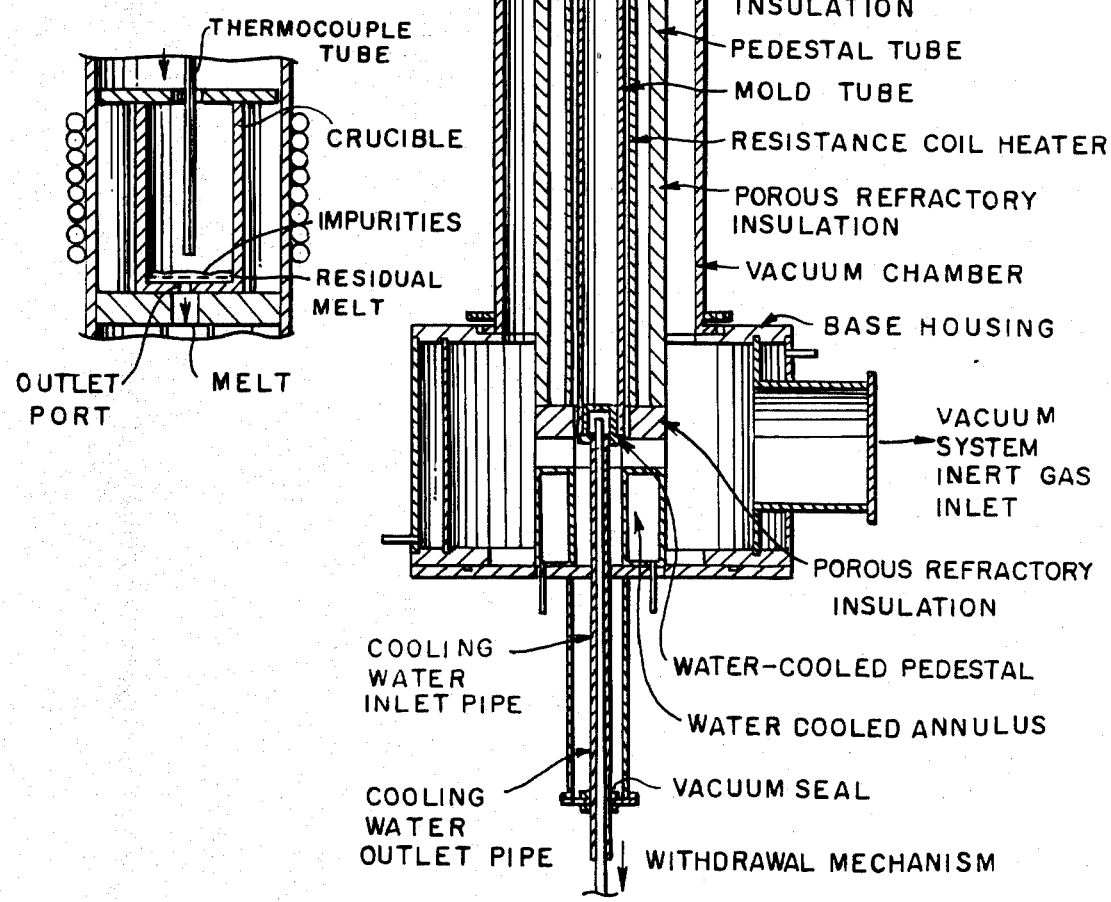
FIG. 1 is an elevational view of an apparatus having preferred features, including a bottom pouring crucible, a downwardly movable mold tube, heating means surrounding the mold tube in its casting position, a cooling pedestal support for the bottom of the mold tube, and auxilliary cooling means.
FIG. 1A is a detail view of the pouring crucible with the thermocouple tube raised.

The method of this invention is applicable generally to magnetostrictive alloys of iron with rare-earth elements. The crystalline alloy compounds have the general formula $ReFe_2$. The rare earths (Re) present may include any rare earth metal.

Commercial grades of electrolytic iron and purified rare earth metals may be employed. The preferred rare earth metals include particularly terbium (Tb), dysposium (Dy), and holmium (Ho). These rare earth metals usually contain small amounts of higher melting impurities, such as refractive oxides, carbides, etc. Preferably, however, the metals should have purities of at least 99.9 wt. %. The processed alloy preferably should not contain interstitial impurities (viz. H, C, N, O and F) in excess of 600 pp by weight (~4000 atomic ppm) or metallic impurities, including other rare earth metals, in excess of about 1000 atomic ppm total.

The magnetostrictive alloys to be used are preferably combinations of iron with terbium and dysposium or terbium and holmium for optimum magnetostrictive properties. Such alloys can be prepared with both holmium and dysposium in combination with iron and terbium. Specific preferred formulations include the following: $Tb_xDy_{1-x}Fe_{1.5-2.0}$, where $0.2<x<1.0$; $Tb_xHo_{1-x}Fe_{2-w}$, where $0.1<x<1.0$; and $Tb_xHo_yDy_zFe_{2-w}$, where $x+y+z=1$, and $0<w<0.5$ in all cases. At present one of the most technologically advanced of these is $Tb_xDy_{1-x}Fe_{1.5-2.0}$, where $0.27<x<0.35$, known as Terfenol-D type alloys, the optimal formula being $Tb_{0.3}Dy_{0.7}Fe_{1.95}$, called "Terfenol".

In preparing the metals for alloying, they should be surface cleaned. Then the appropriate amounts of the metal constituents are weighed and alloyed by means of a conventional arcmelter. Weighing and proportioning should be precise to achieve the exact desired alloy formula. In forming the alloys, it is preferred to alloy the rare earth metals first, and then add the iron. Alloy buttons or fingers thus prepared may be only partially homogenized, viz., they do not need to be fully homogenized by repeated arc-melting and solidification.

A plurality of the buttons or fingers thus formed are charged to a melting crucible to achieve an averaged composition. However, the crucible should contain an amount of each metal corresponding with the exact desired proportions. It is also possible to perform the process by charging the pure materials, iron plus rare-earth pieces, directly into the crucible without previous alloying. Within the crucible, there is formed a molten flowable homogeneous body of the rare earth-iron alloy. The melt can be held in the crucible for a sufficient time to permit full homogenization to develop, and also to permit the lower density solid particles, comprising the higher melting impurities, to float to the top of the melt and collect on its upper surface. It is preferable to utilize low frequency induction heating to enhance mixing of the molten alloy in the crucible.

ILLUSTRATIVE EMBODIMENTS

Figure 2:
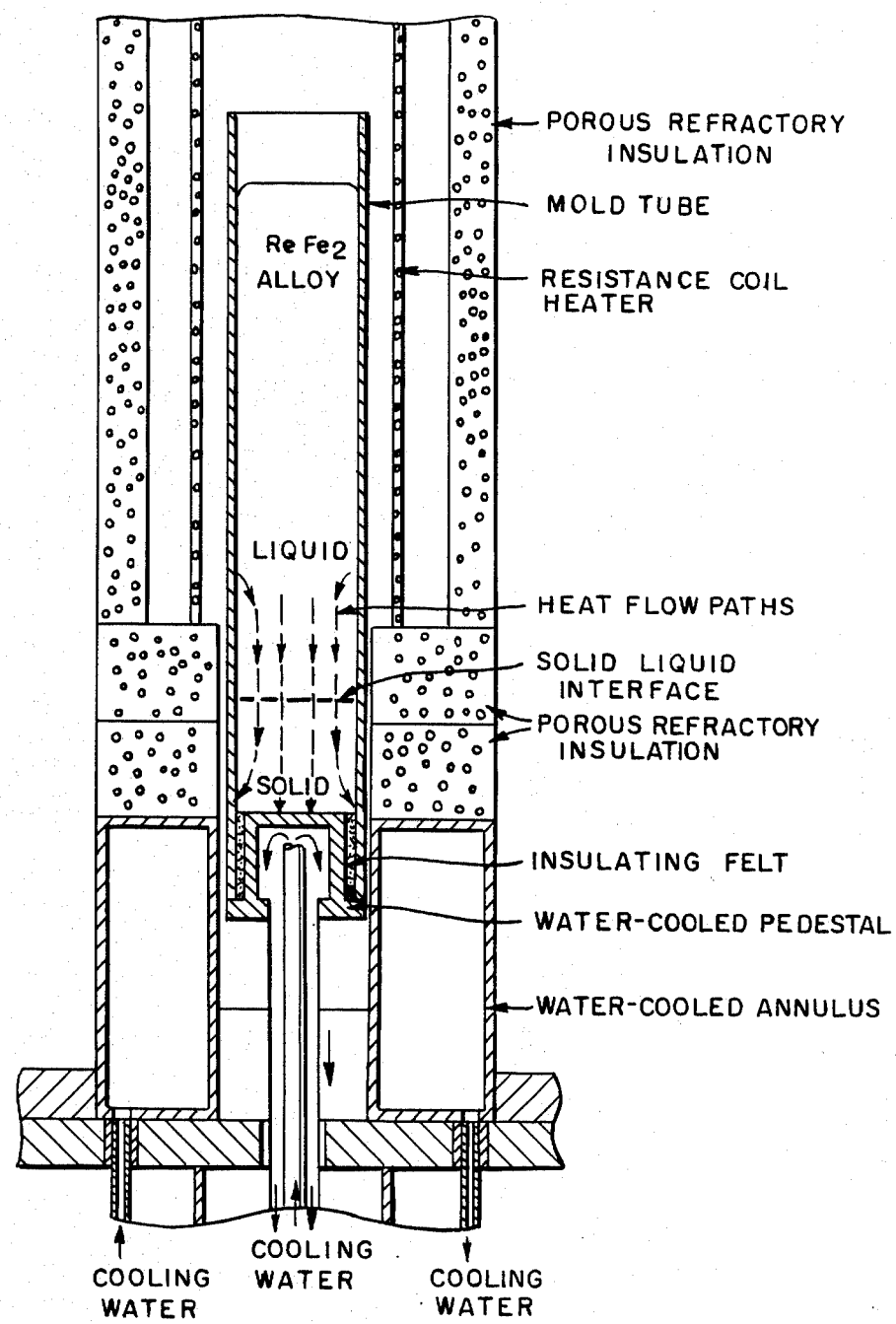
FIG. 2 is an enlarged sectional view of the apparatus of FIG. 1 illustrating the solidification and crystallization steps.

An apparatus for carrying out the method steps of this invention in a preferred embodiment is shown in FIGS. 1, 1A and 2. Reference should therefore be made to these figures and to the descriptive legends thereon in connection with the following explanation.

Looking first at FIG. 1, the apparatus consists of a vacuum base housing on top of which is mounted an elongated vacuum chamber having a removable closure at its upper end. Within the upper portion of the vacuum chamber is mounted a cylindrical crucible, which may be formed of alumina or other suitable refractory material. Located in the bottom wall of the crucible is an outlet port. An openable closure is provided for the outlet port, comprising in this embodiment the lower end of a thermocouple protection tube which may be formed of alumina or other refractory material.

As shown in FIG. 1, in its lower port-closing position, the end of the thermocouple tube is received in the top of the crucible outlet. The bottom end of the thermocouple tube may be rounded or otherwise adjusted for sealing insertion in the port. Connected to the upper end of the thermocouple tube is an operator rod, which slidably extends through an O-ring equipped vacuum seal in the top closure of the vacuum chamber. When the operator rod is lifted, as shown in FIG. 1A, the crucible outlet port is opened for discharge of the melt.

Around the crucible on the outside of the vacuum chamber is placed an induction coil to which a low frequency alternating current is supplied. Located within the vacuum chamber around the crucible in proximity thereto is the induction coil susceptor, which may be formed of tantalum, for heating the crucible. The susceptor and crucible are insulated for retaining heat. For example, refractory insulating material such as porous alumina or zirconia may be used to enclose the susceptor and melt crucible. The base of the crucible can be supported, as shown, through insulation members resting on a tubular pedestal, which may be formed of quartz. Centered beneath the crucible outlet port is a vertically-elongated, rod-forming mold. The mold is preferably formed of quartz. The top of the mold tube is open for receiving melt from the crucible, and the bottom of the tube is closed by a heat-transfer wall. This wall may comprise the upper end of an inverted cup-shaped pedestal. Within the pedestal there is provided a liquid-flow cooling chamber in heat transfer relation to its bottom-wall forming portion. Concentric inlet and outlet water tubes extend downwardly from the pedestal to provide for circulation of cooling water. The pedestal, which may be formed of copper, together with the cooling pipe assembly, functions as a retractable support, permitting downward movement of the mold tube. For this purpose, as indicated in FIG. 1, the cooling water pipe assembly extends through a vacuum seal and is connected externally to a withdrawal mechanism.

For heating the mold tube prior to the deposit of melt therein and/or for a short period of time after receiving the melt, suitable means are also provided. For example, a resistance coil heater is positioned around the outside of the mold tube. This may be a platinum-rhodium resistance coil connected to a current source through a voltage controller.

In operating the apparatus of FIG. 1, by removing the upper closure and the insulation covers, buttons or fingers of the magnetostrictive alloy are introduced into the crucible. The apparatus is then re-assembled and sealed. The vacuum system is started to reduce the pressure within the apparatus to a low vacuum such as $2 \times 10^{-6}$ Torr. The induction coil generator is turned on at a low setting and the alloy charge is allowed to heat slowly while maintaining a vacuum level within the apparatus below at least $4 \times 10^{-5}$ Torr. The crucible and mold tube heaters may be turned on at the same time and heated to selected control temperatures. For example, the alloy may first be heated under vacuum to 1000° C. or other selected pre-melt temperature. The system is then sealed off and an inert gas is introduced, preferably argon gas, which may be admitted to —20 kPa pressure. Heating of the alloy can then be continued until it melts, for example, for Terfenol at a temperature of around 1275° C. With the mold at the desired temperature for receiving the melt, usually at the same temperature as the melt, the thermocouple tube is lifted through the top vacuum seal by a small distance, such as about one-half inch. This permits the molten alloy to flow downwardly through the bottom outlet port. The mold tube is filled to the desired height, but some of the melt is retained in the crucible. Prior to the discharge of the melt from the crucible, impurities will have collected as "dross" at the top of the melt, as indicated in FIG. 1. By leaving a small portion of the melt within the crucible, as indicated in FIG. 1A, the separated impurities are retained in the crucible.

By the use of the low frequency induction melting of the alloy, the action of the induction coil not only melts the alloy but also provides a mixing action in the melt. In this way the homogeneity of the melt is achieved and maintained prior to its discharge from the crucible. This is especially desirable with rare earth-iron magnetostrictive alloys, which tend to separate and become non-homogeneous on melting. The alloy composition, if non-homogeneous on casting, would be very difficult to remix in the elongated mold tube.

Once the melt has been transferred to the mold tube, it is desirable to solidify it as rapidly as possible, while carrying out the solidification progressively from the bottom to the top of the casting. Circulation of cooling water within the base pedestal of the mold tube is preferably started before the transfer of the melt. Removal of heat from the melt through the lower end portion of the mold tube thereby begins concurrently with the transfer of the melt. The heater surrounding the mold tube may be turned off when transfer of the melt has been completed. As heat is removed from the bottom of the mold tube, solidification and crystallization of the alloy takes place first at the very bottom of the rod being formed. The resulting solid-liquid interface then moves progressively upward. This results in axial alignment of the crystals being formed, comprising axially elongated dendrites. To promote the heat removal through the bottom portion of the mold tube, the bottom portion may be partially withdrawn from within the resistance coil heater. As shown in FIG. 2, the base pedestal has been moved downwardly to the level of the water-cooled annulus, which may be formed of copper. Downward heat flow paths are indicated by the dotted arrow lines. In this embodiment, heat can pass through the bottom wall of the mold tube into the pedestal cooling water, and also through the lower end portions of the side walls into the cooling water circulated through the surrounding annulus. In this arrangement, as indicated, the solid-liquid interface may be maintained at the level of porous refractory insulation above the cooling annulus. As the solidification progresses upwardly in the mold, the support pedestal is lowered further. This facilitates additional transfer of heat through the side walls of the mold tube into the water-cooled annulus while still maintaining a downward heat flow in the unsolidified portion of the melt. The process is continued until $ReFe_2$ alloy is completely solidified.

The foregoing combination of heat removal means provides for an optimized control of the axial alignment of the crystalline dendrites formed in the solidification procedure, since nucleation of the dendrites can proceed rapidly with axially aligned growth when propagated by progressive lowering of the pedestal through the water-cooled annulus. Moreover, a further advantage is the "melt-pour-freeze" method of this invention in that it requires the very reactive molten metal alloy to be in contact with the quartz mold tube for a minimum time. This reduces the possibility of impurity pickup.

Figure 3:
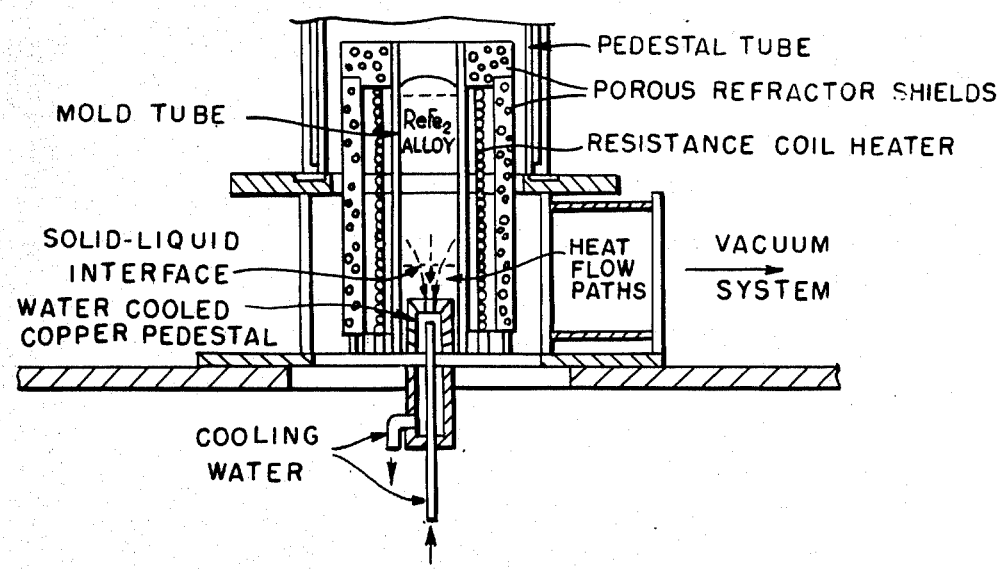
FIG. 3 is a partial elevational view of a modification of the apparatus of FIG. 1 in which the mold tube is mounted on a fixed cooling pedestal.

While the combination described is preferred, certain of the advantages of this invention can also be obtained by using a fixed position mold tube, as illustrated in FIG. 3. In this embodiment, the mold tube is supported on a nonmovable water-cooled pedestal. As with the embodiment of FIGS. 1 and 2, heat is removed through the top of the pedestal. This generates the downward flow of heat, as indicated by the heat flow paths shown in FIG. 3, and generates a solid-liquid interface which progresses from the bottom of the top to the alloy melt. Cooling water is circulated through the support pedestal, as in the embodiment of the other figures.

Figure 4:
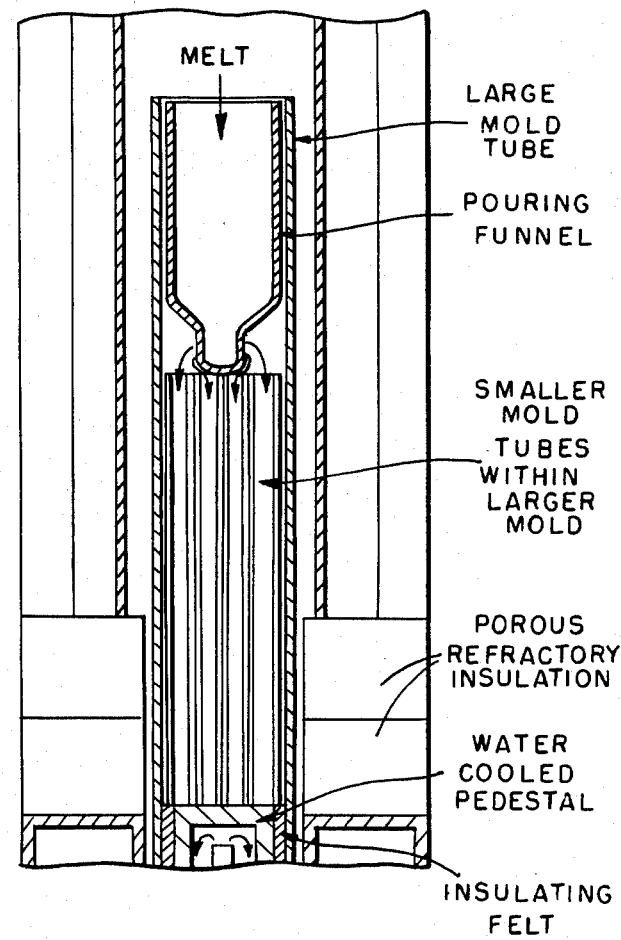
FIG. 4 is an enlarged fragmentary sectional view illustrating a modification in which a plurality of smaller mold tubes are positioned within a larger mold tube.

FIG. 4 illustrates a modification for simultaneous casting of a plurality of small diameter rods. Smaller quartz tubes, as shown in FIG. 4, are positioned within a larger mold support tube. The smaller tubes may be of shorter length than the large mold tube, and a quartz funnel inserted in the top of the mold, as shown. The melt flows from the crucible into the quartz funnel, and then spreads outwardly through appertures in the funnel bottom passing into the tops of the smaller mold tubes. In filling the small tubes, some melt may seep into the spaces between the tubes. This can be removed on completion of the molding operation at the same time as the molded rods are removed from the tubes. Alternately, it may be eliminated by designing the funnel to provide a pouring spout into each tube. The apparatus is disassembled for removal of the rods.

It should be understood that various cross-sectional shapes can be used, that is, a circular cross-section is not required. For example, the large tube or the small tubes may be square, triangular, hexagonal, etc. Rods of various lengths can be formed. For example, an apparatus like that shown in FIGS. 1 and 2 has been used to form 32 to 38 mm diameter rods up to 175 mm long. Using a multiple mold tube arrangement like that of FIG. 4, several 8 mm diameter rods were formed by inserting small quartz tubes 8 mm internal diameter inside a larger mold tube of 32 mm diameter. It is also possible to solidify tube shapes by placing a core inside each quartz tube.

In conducting tests of the method, a Terfenol-type alloy was employed. This alloy was heated by a tantalum susceptor acted on by an 8-turn induction coil powered by a 3000 Hz SCR inverter. A Norton-type AN 299A coarse-grained alumina crucible which had a 3/16 inch hole through the center of its bottom was used. Inserted in the hole was an alumina thermocouple tube of ¼" diameter. At the site of the thermocouple tube there was placed a Pt/Pt13Rh thermocouple for indicating the melt temperature. The thermocouple protection tube had a rounded bottom that effectively sealed the hole in the bottom of the crucible and prevented pouring of the molten alloy before the desired time. The thermocouple tube was lifted at the time of casting by moving a connecting stainless steel tube through a vacuum seal on top of the cover flange of the apparatus. One casting mold used was a 32 mm I.D. quartz tube positioned approximately 5 inches below and centered on the hole in the bottom of the melt crucible. The bottom of the mold was fitted over a water-cooled copper pedestal which extended 1¼ up into the mold, thereby providing a bottom closure for the mold. Zirconia insulating cloth was inserted between the sides of the pedestal and the mold.

We claim:

1. A continuous casting and crystallization method for manufacturing grain-oriented magnetostrictive bodies, comprising the steps of:
   (a) melting and mixing a quantity of a rare earth-iron magnetostrictive alloy in a crucible enclosed within an upper portion of a downwardly-extending chamber by applied induction heating, said crucible having an outlet port through its bottom wall with openable closure means associated therewith;
   (b) depositing a portion of the resulting melt through said outlet port into the open top of at least one vertically-elongated mold tube positioned below the crucible, and
   (c) removing heat from the deposited melt through the lower end portion of the mold tube to progressively solidify said melt, a solid-liquid interface moving upwardly from the bottom to the top of said melt and producing a solidified magnetostrictive body having an axial grain orientation, whereby grain-oriented magnetostrictive bodies are produced without using a sequence of casting, zone melting, and recrystallization steps.

2. The method of claim 1 in which said mold tube is heated prior to the deposit of said melt therein to assist in maintaining said melt in liquid condition above the solid-liquid interface.

3. The method of claim 2 in which the mold tube lower end portion is mounted on retractable support means permitting downward movement of the mold tube within said chamber, said mold tube after the deposit of said melt therein being moved downwardly to promote said progressive solidification.

4. The method of claim 3 in which heating means for said mold tube is provided around said mold tube in its upper melt-receiving position, and the tube is heated thereby before said melt is deposited, the lower end portion of said mold tube being mounted on retractable support means permitting downward movement of the mold tube within said chamber, said mold tube after the deposit of said melt being moved downwardly so that at least its lower end portion is below said heating means, thereby promoting said progressive solidification.

5. The method of claim 4 in which cooling means is provided around a lower portion of said chamber below the melt-receiving position of said mold tube, and said mold tube during said removal of heat therefrom is moved downwardly so that at least its lower end portion is adjacent said cooling means.

6. The method of claim 1 in which the bottom of said mold tube comprises a heat-transfer wall and the lower end portion of said tube is mounted on support means providing a liquid-flow cooling chamber in heat transfer relation with said mold tube bottom wall.

7. A continuous casting and crystallization method for manufacturing grain-oriented magnetostrictive rods, comprising the steps of:
   (a) melting and mixing a quantity of a rare earth-iron magnetostrictive alloy in a crucible enclosed within an upper portion of a downwardly-extending chamber by applied induction heating, said crucible having an outlet port through its bottom wall with openable closure means associated therewith;
   (b) releasing the resulting melt from said crucible through said outlet port by opening said closure means, the said melt being deposited into the open top of at least one vertically-elongated, rod-forming mold tube positioned in said chamber below said crucible, the bottom of said mold tube comprising a heat-transfer wall and the lower end portion of said tube being mounted on support means providing a liquid-flow cooling chamber in heat transfer relation with said mold tube bottom wall;
   (c) providing heating means for said mold tube adjacent the upper melt-receiving position of said mold tube, and heating said mold tube before said melt is deposited therein; and
   (d) removing heat from the deposited melt through the lower end portion of the mold tube so as to progressively solidify said melt with a solid-liquid interface moving upwardly from the bottom to the top of said melt, and producing a solidified magnetostrictive rod having an axial grain orientation whereby grain-oriented magnetostrictive bodies are produced without using a sequence of casting, zone melting, and recrystallization steps.

8. The method of claim 7 in which said tube support means is retractable for downward movement of the mold tube within said chamber, the mold tube after the deposit of said melt being moved downwardly to promote said progressive solidification.

9. The method of claim 7 in which cooling means is provided around a lower portion of said chamber below the melt-receiving position of said mold tube, and said mold tube during said removal of heat therefrom is moved downwardly so that at least its lower end portion is adjacent said cooling means.

10. The method of claim 8 in which cooling means is provided around a lower portion of said chamber below the melt-receiving position of said mold tube, and said mold tube during said removal of heat therefrom is moved downwardly so that at least its lower end portion is adjacent said cooling means.

11. The method of claims 1 to 10 in which said rare earth-iron magnetostrictive alloy is a compound in which iron is alloyed with one or a plurality of rare earth elements.

12. The method of claims 1 to 10 in which said rare earth-iron magnetostrictive alloy is represented by the formula $Tb_xDy_{1-x}Fe_{1.5-2.0}$ wherein x is a number from 0.27 to 0.35.

* * * * *